US010585356B2

(12) United States Patent
Foca et al.

(10) Patent No.: US 10,585,356 B2
(45) Date of Patent: Mar. 10, 2020

(54) PROJECTION EXPOSURE APPARATUS AND METHOD FOR MEASURING A PROJECTION LENS

(71) Applicant: Carl Zeiss SMT GmbH, Oberkochen (DE)

(72) Inventors: Eugen Foca, Ellwangen (DE); Frank Schadt, Neu-Ulm (DE); Uwe Hempelmann, Aalen (DE); Frank Schleicher, Eislingen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/119,218

(22) Filed: Aug. 31, 2018

(65) Prior Publication Data

US 2018/0373163 A1    Dec. 27, 2018

Related U.S. Application Data

(63) Continuation of application No. PCT/EP2017/054930, filed on Mar. 2, 2017.

(30) Foreign Application Priority Data

Mar. 2, 2016  (DE) ........................ 10 2016 203 442

(51) Int. Cl.
   *G01B 11/02* (2006.01)
   *G03B 27/42* (2006.01)
   (Continued)

(52) U.S. Cl.
   CPC ..... *G03F 7/70591* (2013.01); *G01M 11/0271* (2013.01); *G03F 7/70341* (2013.01); *G03F 7/70958* (2013.01)

(58) Field of Classification Search
   CPC .......... G03F 7/706; G03F 9/7026; G03F 9/70; G03F 9/7049; G03F 7/70258;
   (Continued)

(56) References Cited

U.S. PATENT DOCUMENTS

2007/0263187 A1   11/2007  Gustafsson et al.
2008/0180688 A1*  7/2008  Mengel ............... G03F 7/70341
                                                 356/515
(Continued)

FOREIGN PATENT DOCUMENTS

CN   101248238 A    8/2008
CN   101833247 A    9/2010
(Continued)

OTHER PUBLICATIONS

International Search Report and the Written Opinion, PCT/EP2017/054930, date of completion, May 29, 2017, 12 pages.
(Continued)

*Primary Examiner* — Mesfin T Asfaw
(74) *Attorney, Agent, or Firm* — Edell, Shapiro & Finnan, LLC

(57) ABSTRACT

Microlithographic projection exposure apparatus (100) has a projection lens (150) configured to image an object plane (155) onto an image plane (156), wherein an immersion liquid is at least temporarily provided during operation of the projection exposure apparatus between the projection lens and the image plane, wherein a measurement structure (121) is arranged in the immersion liquid, and wherein the measurement structure is configured to generate a measurement pattern. The projection exposure apparatus also has a measurement device (130, 160) configured to measure the measurement pattern. The measurement structure has an absorption layer (125) including silicon oxide and/or silicon oxynitride and/or nitride.

24 Claims, 2 Drawing Sheets

(51) Int. Cl.
*G03F 7/20* (2006.01)
*G01M 11/02* (2006.01)

(58) Field of Classification Search
CPC .............. G03F 9/7034; G03F 7/70341; G03F 7/70591; G03F 7/7085; G03F 7/70883; G03F 7/70833; G03F 7/70133; G03F 7/70308; G03F 9/7088; G03F 7/70275; G03F 7/70641; G03F 1/44; G03F 7/70958
See application file for complete search history.

(56) References Cited

U.S. PATENT DOCUMENTS

| | | |
|---|---|---|
| 2008/0252876 A1 | 10/2008 | Mengel et al. |
| 2009/0017387 A1 | 1/2009 | Shoki |
| 2011/0244373 A1 | 10/2011 | Nozawa et al. |
| 2012/0064438 A1 | 3/2012 | Yoshikawa et al. |
| 2014/0063490 A1 | 3/2014 | Zhang et al. |
| 2014/0127630 A1 | 5/2014 | Shinde et al. |
| 2014/0347654 A1 | 11/2014 | Mengel et al. |
| 2019/0086819 A1* | 3/2019 | Loopstra ............... G03F 7/7015 |

FOREIGN PATENT DOCUMENTS

| | | |
|---|---|---|
| JP | 2008502126 A1 | 1/2008 |
| JP | 2009122566 A | 6/2009 |
| JP | 2011227461 A | 11/2011 |
| JP | 2012003254 A | 1/2012 |
| JP | 2012058593 A | 3/2012 |
| JP | 2015225182 A | 12/2015 |
| KR | 1020050021872 A | 3/2005 |

OTHER PUBLICATIONS

JP Office Action with English translation, JP2018-545909, dated Jul. 30, 2019, 17 pages.
KIPO Office Action with English translation, KR Application No. 10-2018-7024900, dated May 9, 2019, 12 pages.
CN Office Action with English translation, CN Application No. 201780014155.2, 21 pages.

* cited by examiner

PROJECTION EXPOSURE APPARATUS AND METHOD FOR MEASURING A PROJECTION LENS

CROSS REFERENCE TO RELATED APPLICATIONS

This is a Continuation of International Application PCT/EP2017/054930, which has an international filing date of Mar. 2, 2017, and the disclosure of which is incorporated in its entirety into the present Continuation by reference. In addition, this application claims foreign priority under 35 U.S.C. § 119(a)-(d) to German Application No. 10 2016 203 442.1 filed on Mar. 2, 2016, the entire contents of which are hereby incorporated into the present application by reference.

FIELD OF THE INVENTION

The invention relates to a projection exposure apparatus, to a method for measuring a projection lens, and to a measurement structure according to the independent patent claims.

BACKGROUND

US 2008/0252876 A1 discloses a system for measuring an image quality of a projection exposure apparatus. It discloses a projection exposure apparatus having a projection lens. A structure carrier having a measurement structure is provided in the image plane of the projection lens. The measurement structure can be in the form of a chrome layer. The resistance of the measurement structure with respect to degradation due to immersion liquid can be increased with a protection system.

SUMMARY

It is an object of the invention to provide an improved projection exposure apparatus, an improved method for measuring a projection lens, and an improved measurement structure.

According to one formulation, the invention relates to a microlithographic projection exposure apparatus, having a projection lens for imaging an object plane onto an image plane, wherein an immersion liquid is at least temporarily provided during operation of the projection exposure apparatus between the projection lens and the image plane, wherein a measurement structure is arranged in the immersion liquid, wherein the measurement structure is configured to generate a measurement pattern, having a measurement device for measuring the measurement pattern, and wherein the measurement structure comprising silicon oxide and/or silicon oxynitride and/or nitride.

In a further embodiment, the projection exposure apparatus may comprise a measurement structure which at least partially has an absorption layer made of metal silicon dioxide or made of metal silicon oxynitride.

In a further embodiment, the measurement structure at least partially has an absorption layer made of molybdenum silicon dioxide or of molybdenum silicon oxynitride. The measurement structure can have an absorption layer made of molybdenum silicon dioxide.

The measurement structure can likewise have an absorption layer made of molybdenum silicon oxynitride.

The measurement structure may have an absorption layer comprising chromium nitride and/or tantalum nitride and/or hafnium nitride. In a further embodiment, the measurement structure has an absorption layer which is made of chromium nitride and/or tantalum nitride and/or hafnium nitride.

The measurement structure can be applied onto a carrier. The carrier can be formed from quartz glass.
The absorption layer can have a thickness of 10 nm to 100 nm.

The measurement structure can have an anti-reflective layer.

The projection exposure apparatus can have an illumination system that generates electromagnetic radiation having a wavelength in the range of 193 nm or less.

The measurement structure can have an optical density in the range of 3 at a wavelength of 193 nm. The measurement structure can also have an optical density above 3 at a wavelength of 193 nm.

The projection exposure apparatus can be configured to perform a polarized wavefront measurement.

The projection exposure apparatus can be configured to perform a stray light measurement.

The projection exposure apparatus can be configured to perform a shearing interferometer measurement.

The measurement structure can have a grid structure.

The invention furthermore relates to a microlithographic projection exposure apparatus, having a projection lens for imaging an object plane onto an image plane, wherein an immersion liquid is at least temporarily provided during operation of the projection exposure apparatus between the projection lens and the image plane, wherein a measurement structure is arranged in the immersion liquid, wherein the measurement structure is configured to generate a measurement pattern, having a measurement device for measuring the measurement pattern, and wherein the measurement structure has an absorption layer which has a metal nitride for example chromium nitride and/or tantalum nitride and/or hafnium nitride.

The invention additionally relates to a method for measuring a projection lens, wherein a measurement structure is arranged in an immersion liquid in the projection lens, wherein the measurement structure is configured to generate a measurement pattern, wherein the measurement structure at least partially has an absorption layer comprising silicon oxide and/or silicon oxynitride and/or nitride, and wherein the measurement pattern is measured using a measurement device.

In a further embodiment, the measurement structure at least partially has an absorption layer made of molybdenum silicon dioxide and/or of molybdenum silicon oxynitride and/or of chromium nitride and/or of tantalum nitride and/or of hafnium nitride.

The measurement device can perform an interference measurement, in particular a shearing interference measurement.

The measurement device can perform a polarized wavefront measurement.

The measurement device can perform a stray light measurement.

The invention furthermore relates to a measurement structure for measuring a projection lens of a microlithographic projection exposure apparatus, wherein the measurement structure is set up for scattering or diffracting a light beam in an exposure apparatus, and wherein the measurement structure at least partially has an absorption layer comprising silicon oxide and/or silicon oxynitride and/or nitride.

In a further embodiment, the measurement structure at least partially has an absorption layer made of metal silicon dioxide or made of metal silicon oxynitride.

In a further embodiment, the measurement structure at least partially has an absorption layer made of molybdenum silicon dioxide and/or of molybdenum silicon oxynitride and/or of chromium nitride and/or of tantalum nitride and/or of hafnium nitride.

The measurement structure can have a grid structure, wherein the grid structure at least partially has an absorption layer made of molybdenum silicon dioxide and/or of molybdenum silicon oxynitride.

The measurement structure can have an optical density in the range of 3 at a wavelength of 193 nm.

BRIEF DESCRIPTION OF THE DRAWINGS

These aspects of the invention will be explained in more detail below with reference to the figures. In the figures.

DETAILED DESCRIPTION

Figure 1:
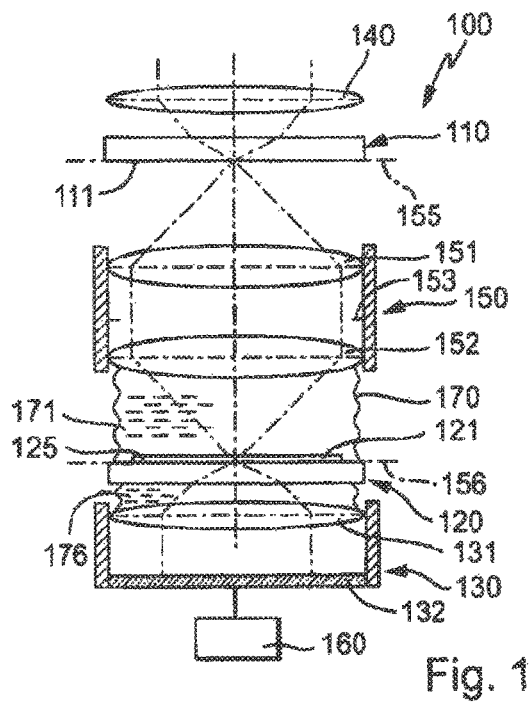
FIG. 1 shows a schematic illustration of the projection exposure apparatus.

FIG. 1 shows a schematic illustration of a projection exposure apparatus 100 having an illumination system 140 for generating electromagnetic radiation. The electromagnetic radiation can have a wavelength range of greater than 193 nm up to an EUV range. A first carrier 110 having a first measurement structure 111 is arranged in the beam path downstream of the illumination system 140. The first measurement structure 111 has structures which are provided for generating an illumination pattern. A projection lens 150 is arranged in the beam path downstream of the first measurement structure 111. An object plane 155 and an image plane 156 of the projection lens 150 are both illustrated in the form of a dashed line. The first measurement structure 111 is arranged in the object plane 155 of the projection lens 150.

The projection lens 150 is illustrated merely schematically and is designed to image an object, which is arranged in the object plane 155 and illuminated using the illumination system 140, into the image plane 156 for microlithographic use. The projection lens 150 is made up of a multiplicity of lens elements and acts as a reduction lens. Mirrors and other optical elements can also be present. FIG. 1 schematically illustrates an entrance-side first lens element 151 and an exit-side last lens element 152. A pupil 153 is arranged between the first and the last lens elements 151, 152. A first immersion space 171 is formed between the last lens element 152 and the image plane 156. The first immersion space 171 is at least temporarily filled during operation of the projection exposure apparatus 100 with an immersion liquid.

FIG. 1 schematically indicates a lateral delimitation 170 of the first immersion space 171. The lateral containment of the immersion liquid is generally determined by the geometry of a device for supplying and removing the immersion liquid (not illustrated in the figure). The immersion liquid can be, for example, extremely pure water having a refractive index of n=1.437 at a wavelength of the electromagnetic radiation of the exposure system 140 of 193 nm. A second carrier 120 having a second measurement structure 121 adjoins the first immersion space 171 such that the second measurement structure 121 is situated in the immersion liquid and is wetted thereby.

A second immersion space 176 is formed downstream of the second carrier 120 in the beam path such that it adjoins said carrier. Provided downstream of the second immersion space 176 in the beam path is a detector 130 which has, for example, a spatially resolving light-sensitive detector element 132 which extends in a two-dimensional manner. A microscope objective 131 is arranged between the second measurement structure 121 and the detector 130. The microscope objective 131 immediately adjoins the second immersion space 176 and directs the light from the second measurement structure 121 onto the detector element 132. The detector 130 is configured to measure an interference pattern. To this end, the detector 130 can be connected to an evaluation unit 160. The evaluation unit 160 is configured to assess a quality of the projection lens 150 on the basis of the captured interference pattern. A shearing interference measuring method, for example, can be used for measuring the interference patterns. The method for performing the shearing interferometry is known and will not be further explained here. The detector 130 and the evaluation unit 160 represent a measurement device.

Figure 2:
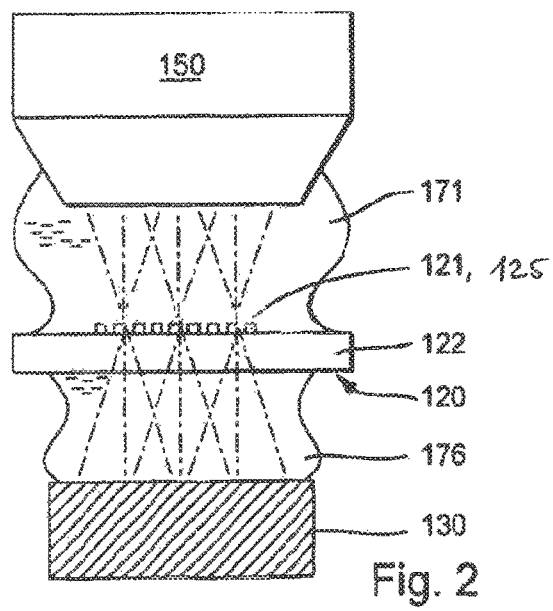
FIG. 2 shows an enlarged illustration of a section of FIG. 1.

FIG. 2 shows an enlarged illustration of a section of FIG. 1. The second measurement structure 121 can be in the form of an absorption layer 125, which is applied onto the second carrier 120 and at least partially or entirely consists of molybdenum silicon dioxide. The absorption layer 125 may comprise silicon oxide and/or silicon oxynitride and/or nitride. Furthermore, the absorption layer may be made of metal-silicon-oxide or metal-silicon-oxynitride. For example molybdenum or magnesium may be used as metal.

Furthermore, the absorption layer may be made of metal silicon dioxide for example molybdenum silicon dioxide and/or of molybdenum silicon oxynitride and/or of chromium nitride and/or of tantalum nitride and/or of hafnium nitride.

The absorption layer 125 can likewise at least partially or entirely consist of molybdenum silicon oxynitride. The absorption layer 125 can likewise at least partially or entirely consist of molybdenum silicon dioxide.

In a further embodiment, the second measurement structure 121 has at least partially an absorption layer 125 which has chromium nitride and/or tantalum nitride and/or hafnium nitride.

Figure 3:
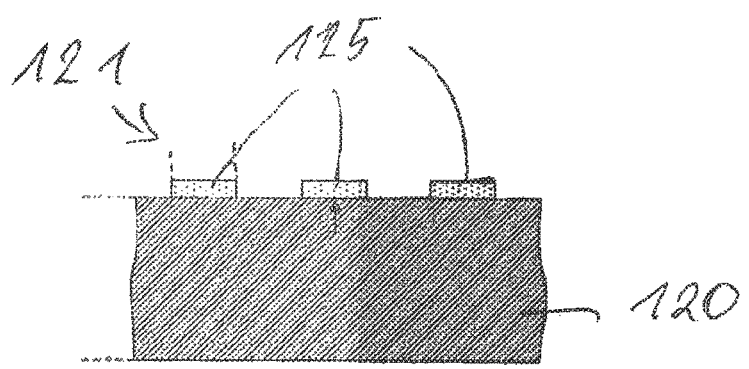
FIG. 3 shows an enlarged illustration of a partial section of a second measurement structure in cross-section.

FIG. 3 shows an enlarged illustration of a partial section of the second measurement structure 121. Individual partial surfaces of the absorption layer 125 are illustrated here. The second carrier 120 can have a thickness, for example, of 5 to 10 mm, in particular a thickness of between 6 and 7 mm, and be made of quartz glass. The absorption layer 125 can have structural elements having a width of 1 to 10 µm and a thickness of 10 to 100 nm. The absorption layer 125 may comprise silicon oxide and/or silicon oxynitride and/or nitride. Furthermore, the absorption layer may be made of metal-silicon-oxide or metal-silicon-oxynitride.

Furthermore, the absorption layer may be made of metal silicon dioxide for example molybdenum silicon dioxide and/or of molybdenum silicon oxynitride and/or of chromium nitride and/or of tantalum nitride and/or of hafnium nitride.

The absorption layer 125 is at least partially or entirely formed from molybdenum silicon dioxide. The absorption layer 125 can likewise at least partially or entirely consist of molybdenum silicon oxynitride.

The absorption layer 125 can likewise at least partially or entirely consist of chromium nitride and/or tantalum nitride and/or hafnium nitride.

Figure 4:
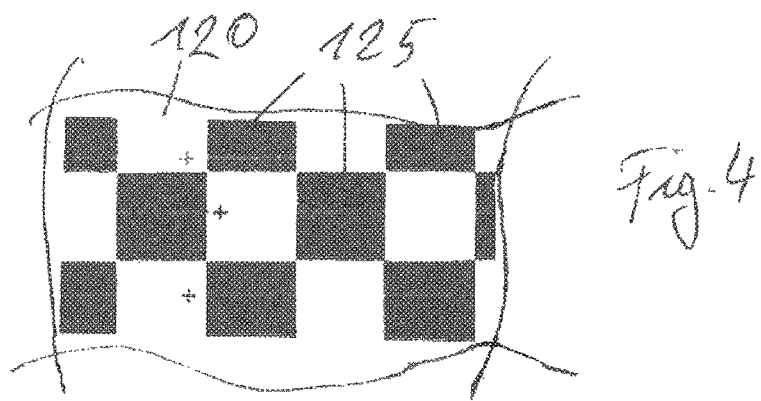
FIG. 4 shows an enlarged illustration of a partial section of a second measurement structure in a top view.

The second measurement structure 121 can have various structures, such as squares in the form of a chessboard pattern, as in FIG. 4. In addition, the second measurement structure 121 can have an absorption layer 125 in the shape of stripes, lines or other areas.

Depending on the embodiment chosen, other layers, such as for example a protection layer and/or an anti-reflection layer, can be provided in addition to the absorption layer 125. The absorption layer 125 may comprise a molybdenum silicon dioxide layer or a molybdenum silicon oxynitride layer.

Tests have shown that the second measurement structure 121 which is at least partially formed from silicon oxide and/or silicon oxynitride and/or nitride and/or metal-silicon-oxide and/or metal-silicon-oxynitride and/or molybdenum silicon dioxide and/or of molybdenum silicon oxynitride and/or of chromium nitride and/or of tantalum nitride and/or of hafnium nitride has a significantly longer lifetime as compared to chromium structures. The proposed materials furthermore offer better structurability and thus increased reproducibility of the measurement results in the case of a displacement of grid locations.

The described second measurement structure 121 can be used, for example, for measuring polarized wavefronts. The proposed second measurement structure 121 can furthermore also be used for distortion measurement techniques, for example on Moiré basis. The proposed second measurement structure 121 meets the requirements relating to the degradation and transmission, but also the requirements relating to the edge roughness and minor structuring errors.

The second measurement structure 121 can furthermore also be used in the field of stray light metrology, in particular for measuring short-range stray light. The second measurement structure 121 can in particular be used for the Kirk test.

Depending on the embodiment chosen, the first measurement structure 111 can also be configured analogously to the second measurement structure 121. Consequently, the first measurement structure 111 can also have an absorption layer 125. The absorption layer 125 may comprise silicon oxide and/or silicon oxynitride and/or nitride. Furthermore, the absorption layer may be made of metal-silicon-oxide or metal-silicon-oxynitride. Furthermore, the absorption layer may be made of metal silicon dioxide for example molybdenum silicon dioxide and/or of molybdenum silicon oxynitride and/or of chromium nitride and/or of tantalum nitride and/or of hafnium nitride.

The adsorption layer 125 may at least partially consist of molybdenum silicon dioxide and/or of molybdenum silicon oxynitride. Even though the first measurement structure 111 is not arranged in an immersion liquid in the case of a shearing interferometer as illustrated in FIG. 1, the increased degradation resistance is advantageous even for the first measurement structure 111. Molybdenum silicon dioxide and molybdenum silicon oxynitride can be referred to as binary intermetallic layer.

The shearing interferometry can be used, for example, to perform a wavefront measurement. Depending on the embodiment chosen, the second measurement structure 121 can also be arranged outside the image plane 156. The arrangement of the second measurement structure 121 depends on the measurement method used.

LIST OF REFERENCE SIGNS 100 projection exposure apparatus
110 first carrier
111 first measurement structure
120 second carrier
121 second measurement structure
125 absorption layer
130 detector
131 microscope objective
132 detector element
140 illumination system
150 projection lens
151 first lens element
152 last lens element
153 pupil
155 object plane
156 image plane
160 evaluation unit
170 delimitation
171 first immersion space
176 second immersion space

What is claimed is:

1. Microlithographic projection exposure apparatus, comprising:
    a projection lens configured to image an object plane onto an image plane,
    an immersion liquid provided at least temporarily during operation of the projection exposure apparatus between the projection lens and the image plane,
    a measurement structure arranged in the immersion liquid, wherein the measurement structure is configured to generate a measurement pattern, and
    a measurement device configured to measure the measurement pattern,
    wherein the measurement structure comprises an absorption layer comprising at least one of: silicon oxide, silicon oxynitride, and nitride, and
    wherein the absorption layer is situated to be, during the operation, wetted by the immersion liquid.

2. Projection exposure apparatus according to claim 1, wherein the absorption layer of the measurement structure is made of metal silicon dioxide or is made of metal silicon oxynitride.

3. Projection exposure apparatus according to claim 1, wherein the absorption layer of the measurement structure is made of molybdenum silicon dioxide.

4. Projection exposure apparatus according to claim 1, wherein the absorption layer of the measurement structure is made of molybdenum silicon oxynitride.

5. Projection exposure apparatus according to claim 1, wherein the absorption layer of the measurement structure comprises at least one of chromium nitride, tantalum nitride, and hafnium nitride.

6. Projection exposure apparatus according to claim 1, wherein the absorption layer of the measurement structure is made of at least one of chromium nitride, tantalum nitride, and hafnium nitride.

7. Projection exposure apparatus according to claim 1, wherein the measurement structure is applied onto a carrier.

8. Projection exposure apparatus according to claim 1, wherein the absorption layer has a thickness of 10 nm to 100 nm.

9. Projection exposure apparatus according to claim 1, wherein the measurement structure further comprises an anti-reflection layer.

10. The projection exposure apparatus according to claim 1, further comprising an illumination system that generates electromagnetic radiation having a wavelength of less than or equal to 193 nm.

11. Projection exposure apparatus according to claim 1, wherein the measurement structure has an optical density of at least approximately 3 at a wavelength of 193 nm.

12. Projection exposure apparatus according to claim 1, configured to perform a shearing interference or other interference measurement, a polarized wavefront measurement or a stray light measurement.

13. Projection exposure apparatus according to claim 1, wherein the measurement structure has a grid structure.

14. Projection exposure apparatus according to claim 1, wherein the absorption layer is separated from the immersion liquid on no more than a single side of the absorption layer.

15. Microlithographic projection exposure apparatus, comprising:
 a projection lens configured to image an object plane onto an image plane,
 an immersion liquid provided at least temporarily during operation of the projection exposure apparatus between the projection lens and the image plane,
 a measurement structure arranged in the immersion liquid, wherein the measurement structure is configured to generate a measurement pattern, and
 a measurement device configured to measure the measurement pattern,
 wherein the measurement structure comprises a metal nitride absorption layer, and
 wherein the metal nitride absorption layer is situated to be, during the operation, wetted by the immersion liquid.

16. Projection exposure apparatus according to claim 15, wherein the absorption layer of the measurement structure is made of chromium nitride.

17. Projection exposure apparatus according to claim 15, wherein the absorption layer of the measurement structure is made of tantalum nitride.

18. Projection exposure apparatus according to claim 15, wherein the absorption layer of the measurement structure is made of hafnium nitride.

19. Method for measuring a projection lens, comprising:
 arranging a measurement structure in an immersion liquid in the projection lens,
 generating, via the measurement structure, a measurement pattern, wherein the measurement structure comprises an absorption layer comprising at least one of: silicon oxide, silicon oxynitride, and nitride, and wherein the absorption layer is wetted by the immersion liquid during said generating, and
 measuring the measurement pattern using a measurement device.

20. Method according to claim 19, wherein the measurement structure comprises an absorption layer made of molybdenum silicon dioxide or of molybdenum silicon oxynitride or of chromium nitride or of tantalum nitride or of hafnium nitride.

21. Method according to claim 19, wherein the measurement device performs a shearing interference or other interference measurement, a polarized wavefront measurement or a stray light measurement.

22. Measurement structure configured for measuring a projection lens of a microlithographic projection exposure apparatus and arranged for scattering or diffracting a light beam projected in the projection exposure apparatus, comprising:
 an absorption layer comprising at least one of: silicon oxide, silicon oxynitride, and nitride,
 wherein the absorption layer is configured to be in direct contact with and wetted by an immersion liquid during the measuring of the projection lens.

23. Measurement structure according to claim 22, wherein absorption layer of the measurement structure is made of metal silicon dioxide or is made of metal silicon oxynitride.

24. Measurement structure according to claim 22, wherein the absorption layer of the measurement structure is made of at least one of: molybdenum silicon dioxide, molybdenum silicon oxynitride, chromium nitride, tantalum nitride, and hafnium nitride.

* * * * *